US005872794A

United States Patent [19]
Cook et al.

[11] Patent Number: 5,872,794
[45] Date of Patent: Feb. 16, 1999

[54] FLASH EPROM CONTROL WITH EMBEDDED PULSE TIMER AND WITH BUILT-IN SIGNATURE ANALYSIS

[75] Inventors: Brian E. Cook, Houston; Jeffery T. Richardson; Yu-Ying Jackson Leung, both of Sugar Land, all of Tex.

[73] Assignee: Texas Instruments Incorporated, Dallas, Tex.

[21] Appl. No.: 967,206

[22] Filed: Oct. 29, 1997

Related U.S. Application Data

[63] Continuation of Ser. No. 668,076, Jun. 14, 1996, abandoned, which is a continuation of Ser. No. 315,526, Sep. 30, 1994, abandoned.

[51] Int. Cl.⁶ ................................................. G01R 31/28
[52] U.S. Cl. ........................................ 371/22.4; 371/22.32
[58] Field of Search .................................. 371/22.4, 21.1, 371/21.2, 22.31, 22.32, 22.34, 22.35, 22.5, 22.6, 27.5; 395/183.06, 182.03, 182.06, 182.18, 183.18; 365/201

[56] References Cited

U.S. PATENT DOCUMENTS

| | | | |
|---|---|---|---|
| 4,594,711 | 6/1986 | Thatte | 371/22.3 |
| 4,801,870 | 1/1989 | Eichelberger et al. | 371/25.1 |
| 4,903,266 | 2/1990 | Hack | 371/21.2 |
| 4,991,175 | 2/1991 | Easingwood-Wilson | 371/22.4 |
| 5,319,646 | 6/1994 | Simpson | 371/22.3 |

*Primary Examiner*—Robert W. Beausoliel, Jr.
*Assistant Examiner*—Nadeem Iqbal
*Attorney, Agent, or Firm*—Robby T. Holland; Carl H. Hoel; Richard L. Donaldson

[57] ABSTRACT

Built-In-Logic-Block-Observation registers BILBO are coupled to the output of a Control-Read-Only-Memory CROM in the write-state-machine of a flash EPROM. The Built-In-Logic-Block-Observation registers BILBO include master/slave latches M/SL, shadow latches SHL, and other logic circuitry that enable the various modes of operation required for pulse timing and for signature analysis. During operation a pre-defined FLASH command sequence requests a Control-Read-Only-Memory CROM signature analysis that executes a set of instructions causing the Built-In-Logic-Block-Observation registers BILBO to be placed in the Multiple-Input-Signature-Register Mode and that steps through the Control-Read-Only-Memory CROM until all valid addresses have been evaluated. The resultant Control-Read-Only-Memory CROM signature is then scanned out and verified. The invention eliminates the need for a separate stand-alone Linear-Feedback-Shift-Register LFSR used for pulse timing. The contents of the Control-Read-Only-Memory CROM are verified without the necessity for time-consuming scanning-out of each word.

11 Claims, 5 Drawing Sheets

FLASH EPROM CONTROL WITH EMBEDDED PULSE TIMER AND WITH BUILT-IN SIGNATURE ANALYSIS

This application is a continuation application Ser. No. 08/668,076 filed Jun. 14, 1996., now abandoned, which is a continuation of application Ser. No. 08/315,526, filed Sep. 30, 1994, now abandoned.

BACKGROUND OF THE INVENTION

The present invention relates to a nonvolatile, integrated-circuit memory array such as a flash erasable, electrically programmable read-only-memory (flash EPROM or flash EEPROM) array. In particular, the invention relates to control of the programming and erasing of a flash EPROM memory array.

Flash EPROMs of the type discussed herein are described in: (a) "A Single Transistor EEPROM cell and its implementation in a 512K CMOS EEPROM", S. Mukherjee et al., IEDM 1985 (p. 616–619) and in (b) "A 90ns 100K Erase/Program Cycle Megabit Flash Memory", V. Kynett et al., ISSCC 1989 (p. 140–141). The topic of reference (a) is also discussed in U.S. Pat. No. 4,698,787.

As flash memory technology continues to evolve, the demand for increasing ease of use has resulted in development of automated instructions for programming and erasing flash EPROMs. The automated program and erase instructions are embedded in the Write-State-Machine architecture of such flash EPROMs. The codes for those instructions are, for example, stored in a Control-Read-Only-Memory in the Write-State-Machine. The codes may include about 400 words of program and erase instructions and the Control-Read-Only-Memory may, for example, be mask-programmed with those codes during manufacture using any one of several known methods.

The proper functioning of the Control-Read-Only-Memory is crucial to the operation of flash EPROMs. Therefore, it is necessary to verify after manufacture that the Control-Read-Only-Memory is, in fact, programmed properly. However, because the Control-Read-Only-Memory is embedded in the Write-State-Machine, the Control-Read-Only-Memory inputs and outputs are not directly accessible for that verification testing. Even though the Control-Read-Only-Memory is not large (having perhaps 9 inputs and 50 outputs), the large number of outputs makes test observation difficult.

Compact testing methods, or testing methods based on checking an output function derived from a response rather than the response itself, are discussed in Abramovici et al., "Digital Systems Testing and Testable Design", Computer Science Press, New York (1990). Such derived output functions are sometimes called "signatures", or compressed representations of the true responses. Compact testing methods, or Built-In-Self-Test (BIST) architectures, generally require less memory than true-response test methods. One such compact testing method uses Built-In-Logic-Block-Observation (BILBO) registers and is discussed in Section 11.4.12 of the foregoing Abramovici et al. reference. The basic Built-In-Logic-Block-Observation Built-In-Self-Test architecture consists of partitioning a circuit into a set of registers and blocks of combinational logic, where the normal registers are replaced by Built-In-Logic-Block-Observation registers. In Built-In-Logic-Block-Observation register design, the inverted output of a storage cell is connected via a NOR and an exclusive OR gate to the data input of the next cell.

One of the problems associated with programming and erasing flash EPROMs is that significant silicon area is consumed by a Linear-Feedback-Shift-Register used for pulse timing. Another problem is that significant test time is required for verification of the contents of the Control-Read-Only-Memory because each programmed word must be separately scanned out. There is a need to conserve silicon area and to decrease the time required for verifing the Control-Read-Only-Memory contents.

SUMMARY OF THE INVENTION

This invention solves the foregoing problems by use of Built-In-Logic-Block-Observation (BILBO) circuitry coupled to the output of the Control-Read-Only-Memory. The Built-In-Logic-Block-Observation circuitry includes master/slave latches, shadow latches, and other logic circuitry that enable the various modes of operation required for pulse timing and for signature analysis. During operation, for example, a pre-defined FLASH command sequence requests a Control-Read-Only-Memory signature analysis that executes a set of instructions causing the Built-In-Logic-Block-Observation registers to be placed in the Multiple-Input-Signature-Register Mode, then stepping through the Control-Read-Only-Memory until all valid addresses have been evaluated. The resultant Control-Read-Only-Memory signature is then scanned out and verified.

One advantage of the invention is that the need for a separate stand-alone Linear-Feedback-Shift-Register used for pulse timing is eliminated. Another advantage of the invention is that verification of the contents of the Control-Read-Only-Memory is accomplished without the time-consuming scanning-out of each programmed word. The user-command-initiated Control-Read-Only-Memory signature analysis requires a reduced number of test routines and decreased test time as compared to the prior-art full scan for each Control-Read-Only-Memory word.

In addition, the length of the Linear-Feedback-Shift-Register used for pulse timing is limited only by the size of the Control-Read-Only-Memory word. That feature is useful for maintaining pulse widths as controller clock frequencies increase.

DETAILED DESCRIPTION OF THE INVENTION

Figure 1:
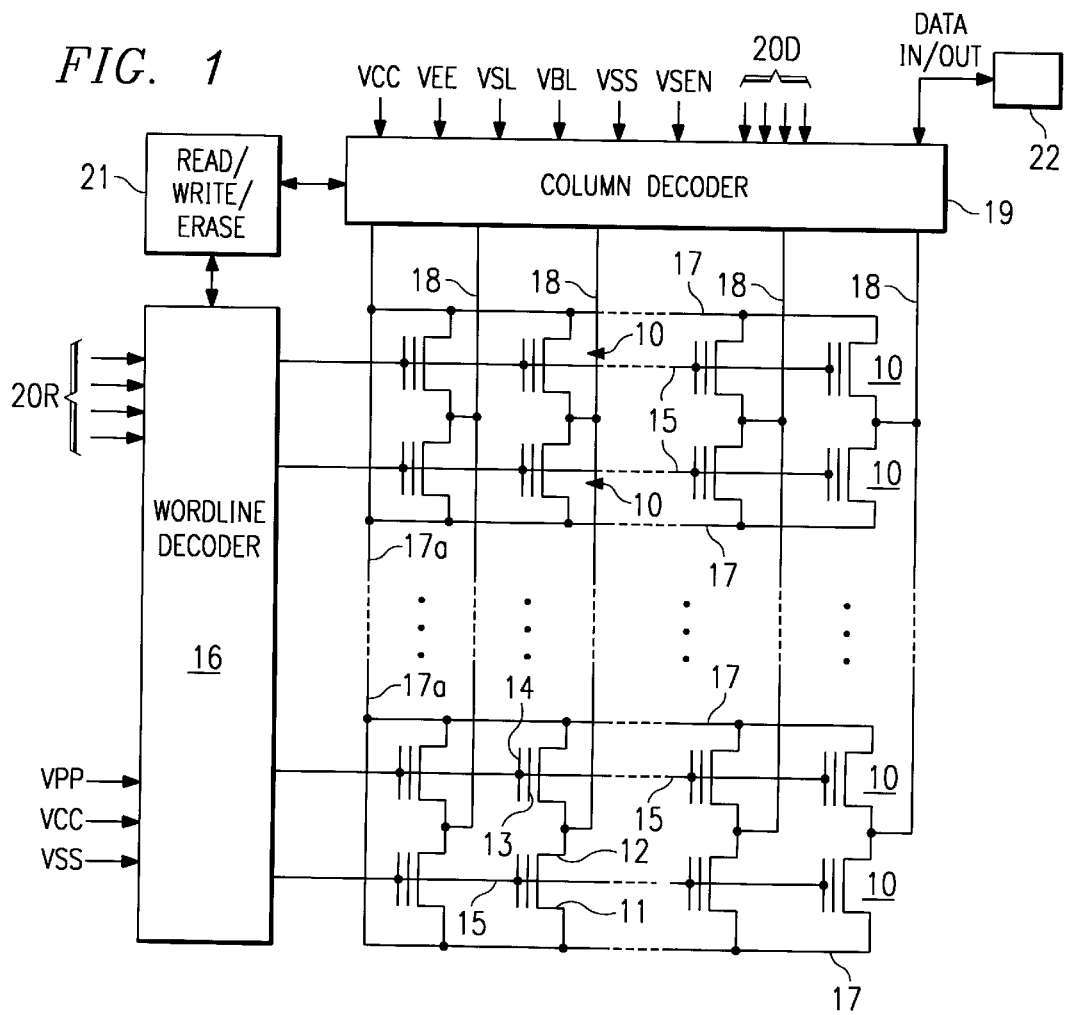
FIG. 1 is an electrical schematic diagram, in partial block form, of a flash memory.

Referring to FIG. 1, an example array of memory cells, which is an integral part of a memory chip, is shown for the purpose of illustrating use of the method and circuitry of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20R and to signals from Read/Write/Erase control circuit 21 (or microprocessor 21), to apply a preselected positive voltage VCC (approx. +5V) to the selected wordline 15, and to apply a low voltage (ground or VSS) to deselected wordlines 15. The column decoder 19 functions to apply a preselected positive voltage VSEN (approx. +1V) to at least the selected drain-column line 18 and to apply a low voltage (0V) to the source line 17. The column decoder 19 also functions, in response to signals on address lines 20D, to connect the selected drain-column line 18 of the selected cell 10 to the DATA IN/OUT terminal 22. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 functions to leave all drain-column lines 18 floating (connected to a high impedance such as field-effect transistor biased in "OFF" condition). The wordline decoder 16 functions to connect all the wordlines 15 to VSS, which may be ground or 0V. The column decoder 19 also functions to apply a positive voltage VEE (approx. +10V to +15V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is at reference voltage VSS, the cell 10 remains in the nonconducting state during erase.

In a write or program mode, the wordline decoder 16 may function, in response to wordline address signals on lines 20R and to signals from Read/Write/Erase control circuit 21, (or microprocessor 21) to place a preselected first programming voltage VPP (approx. +12V) on a selected wordline 15, including a selected control-gate 14. Column decoder 19 also functions to place a second programming voltage VBL (approx. +5 to +10V) on a selected drain-column line 18 and, therefore, the drain 12 of selected cell 10. Source lines 17 are connected to reference potential VSS, which may be ground. All of the deselected drain-column lines 18 are connected to reference potential VSS or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2V to −6V with respect to the channel region (with the control gate 14 at 0V). For memory cells 10 fabricated in accordance with the example embodiment, the coupling coefficient between a control gate 14/wordline 15 and a floating gate 13 is approximately 0.6. Therefore, a programming voltage VPP of 12V, for example, on a selected wordline 15, including the selected control gate 14, places a voltage of approximately +7.2V on the selected floating gate 13. The voltage difference between the floating gate 13 (at approx. +7.2V) and the grounded (approx. 0v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with +5V on its control gate, a state which is read as a "zero" bit. Non-programmed cells 10 have source-drain paths under the floating gate 13 that are conductive with +5V on their control gates, and those cells 10 are read as "one" bits.

For convenience, a table of read, write and erase voltages is given in TABLE I below:

TABLE I

|  | Read | Flash Erase | Program |
| --- | --- | --- | --- |
| Selected Wordline | 5 V | 0 V (All) | +12 V |
| Deselected Wordlines | 0 V | — | 0 V |
| Selected Drain Line | 1.0 V | Float (All) | +5 V to +10 V |
| Deselected Drain Lines | 0 V/Float | — | Float |
| Source Lines | 0 V | +10 V or +15 V | 0 V |

Figure 2:
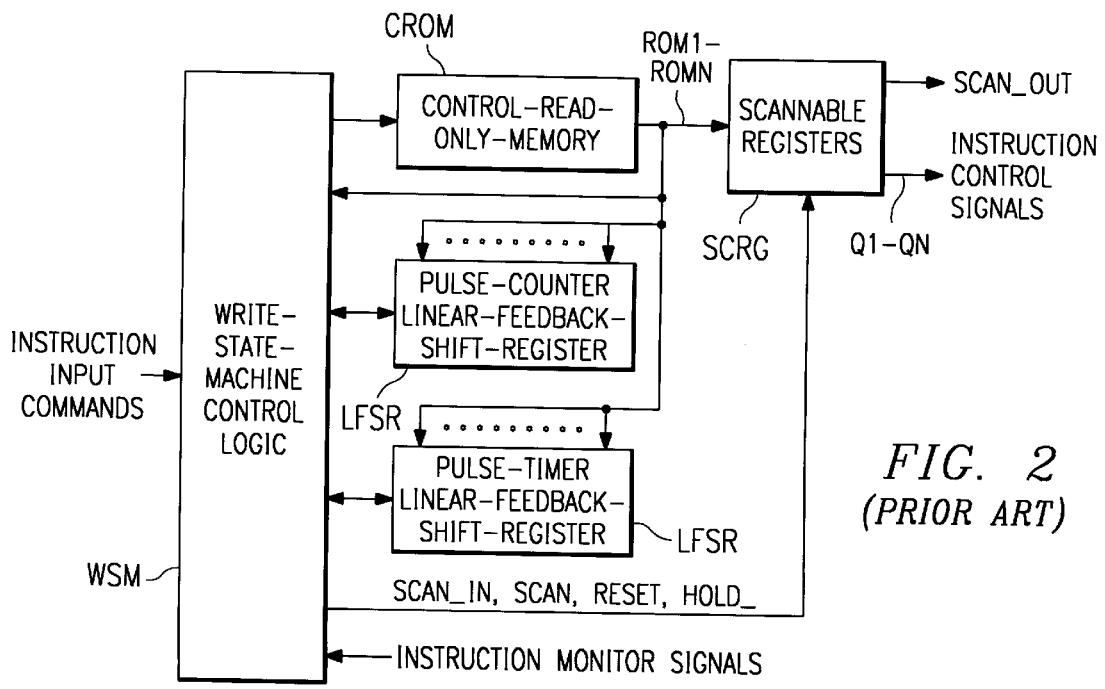
FIG. 2 is a block diagram circuit illustrating a Control-Read-Only-Memory used with prior-art scannable registers in a write-state-machine of a flash EPROM.
Figure 3:
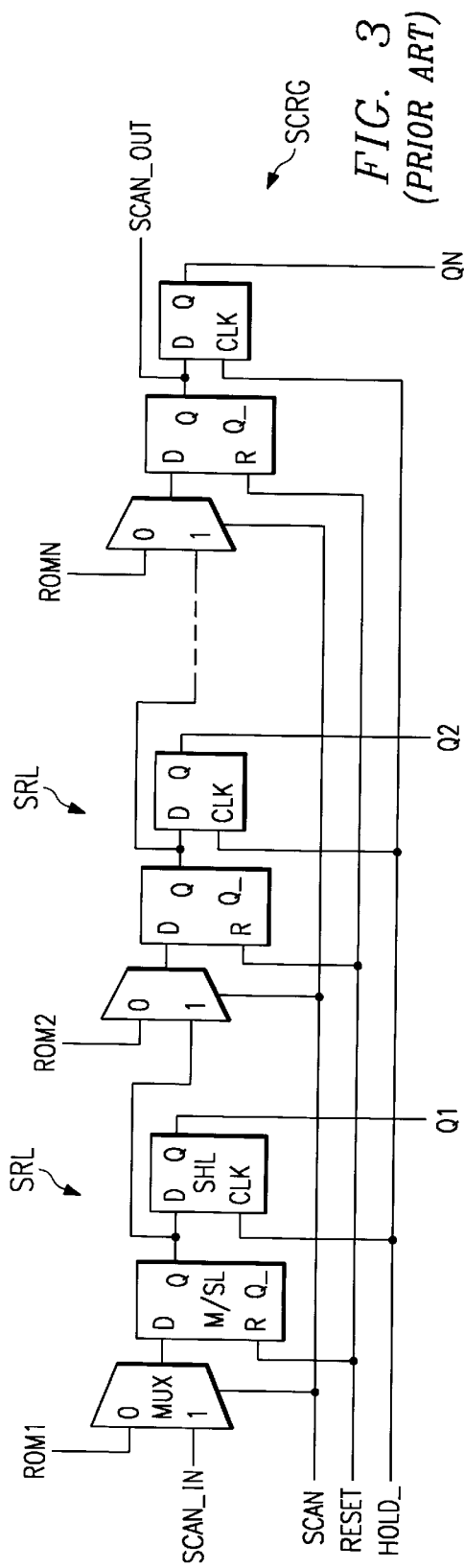
FIG. 3 is an electrical schematic diagram in partial block-diagram form illustrating the prior-art scannable registers of FIG. 2.

The device of this invention is a part of Read/Write/Erase control circuit 21 of FIG. 1. As illustrated in FIG. 2, prior-art control circuitry contains a Control-Read-Only-Memory CROM coupled to scannable registers SCRG. As illustrated in FIG. 3, prior-art scannable registers SCRG includes a scan input SCAN_IN and inputs SCAN, RESET and HOLD_ that provide instructions to the scannable registers SCRG from the control-Read-Only-Memory CROM. Also, output Shift-Register-Latches SRL are used for scanning out the contents of the Control-Read-Only-Memory CROM. Each output Shift-Register-Latch SRL includes a multiplexer MUX and a master/slave latch M/SL, as shown in FIG. 3. While this technique verifies the contents of the Control-Read-Only-Memory CROM, the process of observing all addresses takes an unnecessarily long test time since the length of the entire scan chain may require as many as 200 Shift-Register-Latches SRL.

Figure 4:
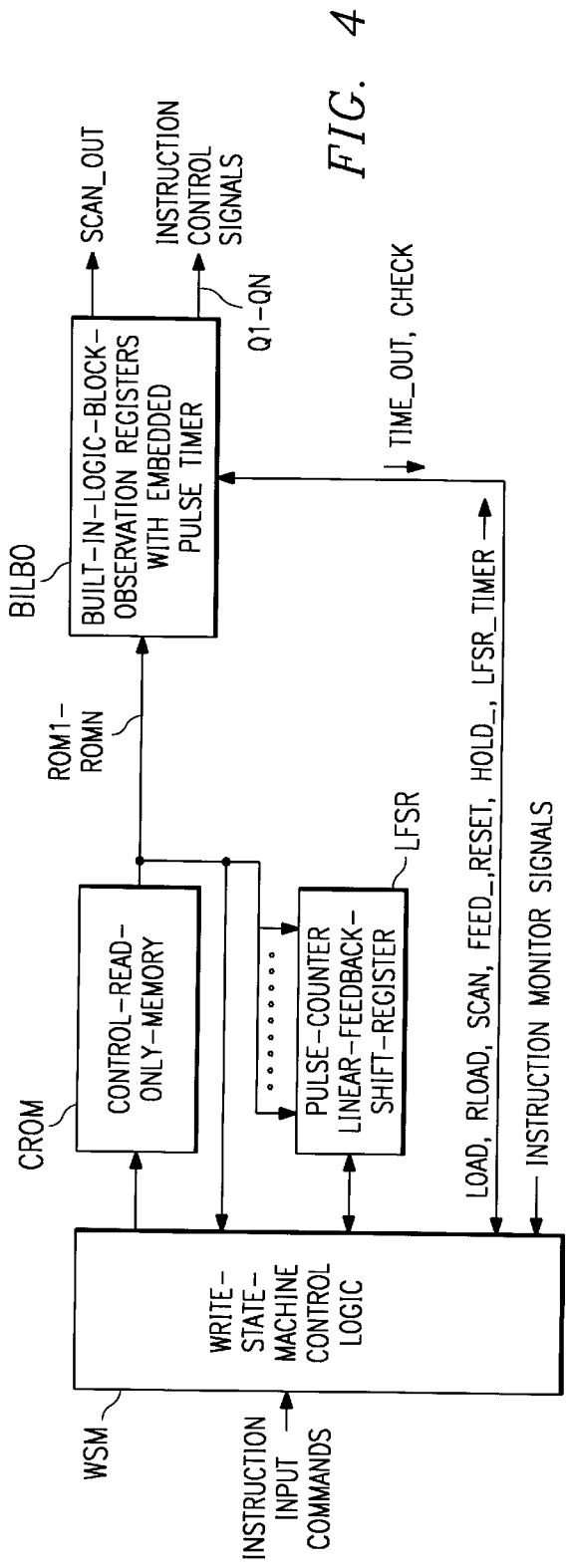
FIG. 4 is a block diagram circuit illustrating a Control-Read-Only-Memory used with the Built-In-Logic-Block-Observation registers of this invention in a write-state-machine of a flash EPROM.
Figure 5A:
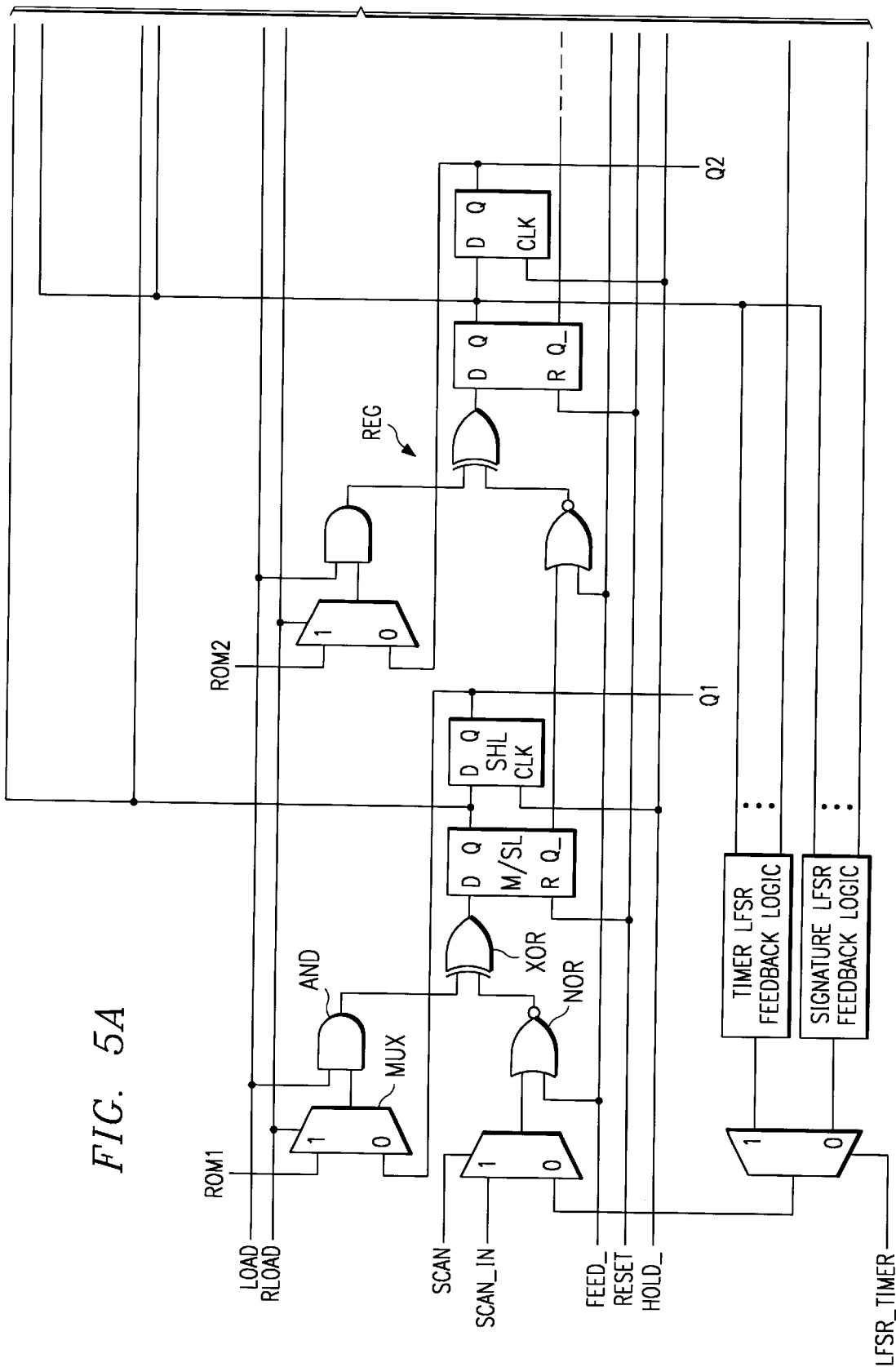
FIG. 5 is an electrical schematic diagram in partial block-diagram form illustrating the Built-In-Logic-Block-Observation registers of FIG. 4.
Figure 5B:
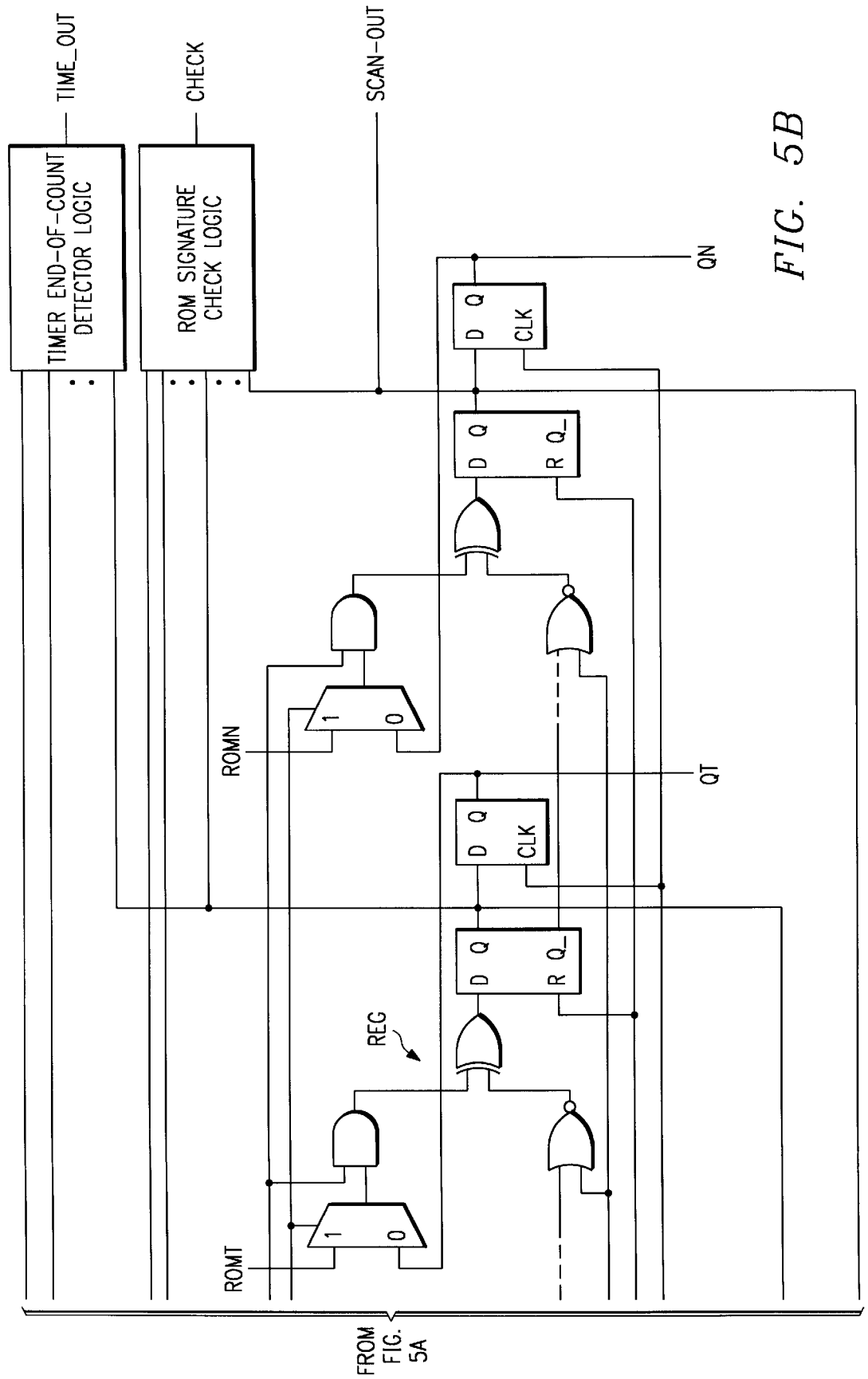

In this invention, the time required to test the Control-Read-Only-Memory CROM is reduced by using a Built-In-Self-Test BIST, in which the output Shift-Register-Latches SRL are connected together as improved Built-In-Logic-Block-Observation registers BILBO, as illustrated in FIGS. 4 and 5.

Depending on the state of the control inputs LOAD, RLOAD, SCAN, FEED_, RESET, HOLD_ and LFSR_ TIMER (SCAN_IN is not a control input) of FIG. 5; the Built-In-Logic-Block-Observation registers BILBO operate in one of eight modes. Those modes are the Parallel-Load-Active Mode, the Parallel-Load-Hold Mode, the Linear-Feedback-Shift-Register LFSR Timer Mode, the Linear-Feedback-Shift-Register LFSR Signature Mode, the Scan- Shift Mode, the Shadow-Load Mode, the Shadow-Observe Mode and the Reset Mode.

In the Parallel-Load-Active Mode of operation, the data from the Control-Read-Only-Memory CROM are loaded into the master/slave latches M/SL at terminals ROM1–ROMN of FIG. 5. Data exit the shadow latches SHL at terminals Q1–QN.

In the Parallel-Load-Hold Mode of operation, data from the Control-Read-Only-Memory CROM are loaded into the master/slave latches M/SL at terminals ROM1–ROMN of FIG. 5 while the data in the shadow latches SHL are held constant.

In the Linear-Feedback-Shift-Register LFSR Timer Mode of operation, the registers REG are configured to count in a pseudo-random manner while the data stored in the shadow latches SHL are held constant. Each register REG includes a multiplexer MUX, an AND circuit AND, a NOR circuit NOR, an exclusive OR circuit XOR and a master/slave latch M/SL connected as shown in FIG. 5.

In the Linear-Feedback-Shift-Register LFSR Signature Mode of operation, the registers REG are configured as an Multiple-Input-Shift-Register MISR while the data stored in the shadow latches SHL are held constant.

In the Scan-Shift Mode of operation, scan data SCAN_IN is clocked through the registers REG and exits the last master/slave latch M/SL at terminal SCAN_OUT. The data stored in the shadow latch SHL is held constant.

In the Shadow-Load Mode of operation, data from the master/slave latch M/SL are loaded into the shadow latch SHL.

In the Shadow-Observe Mode of operation, data from the shadow latch SHL are loaded into the master/slave latch M/SL.

In the Reset Mode of operation, the master/slave latches M/SL and the shadow latches SHL are reset.

Table 2 below indicates settings for each mode of operation:

Load-Hold Mode. During wait states in the instruction sequence, such as during the program or erase pulse, the Built-In-Logic-Block-Observation registers BILBO are placed in the Linear-Feedback-Shift-Register LFSR Timer Mode. Prior to entering this Mode, the Built-In-Logic-Block-Observation registers BILBO are loaded, using the Parallel-Load-Hold Mode, with a specific pattern determined by the wait time desired. Once loaded, the Built-In-Logic-Block-Observation registers BILBO are placed in the Linear-Feedback-Shift-Register LFSR Timer Mode and the registers count until a predefined pattern is detected (using Timer End-Of-Count Detector Logic) signifying the end of the wait time. The instruction sequence then resumes execution after placing the Built-In-Logic-Block-Observation registers BILBO in the appropriate mode.

In order to verify the contents of the Control-Read-Only-Memory CROM, the Built-In-Logic-Block-Observation registers BILBO are placed in the Linear-Feedback-Shift-Register LFSR Signature Mode. While configured as an Multiple-Input-Shift-Register MISR, the Control-Read-Only-Memory CROM is sequenced through all addresses and data from the Control-Read-Only-Memory CROM are exclusive OR'd with data from the prior master/slave latch. Once the entire Control-Read-Only-Memory CROM has been loaded, the Built-In-Logic-Block-Observation registers BILBO are placed in the Scan-Shift Mode and the contents of the Built-In-Logic-Block-Observation registers BILBO are scanned out for verification. Alternatively, once the Control-Read-Only-Memory CROM code has been loaded into the Built-In-Logic-Block-Observation registers BILBO, an additional Control-Read-Only-Memory CROM word may be loaded that forces the contents of the Built-In-Logic-Block-Observation registers BILBO to a predetermined state that is verifiable on chip (using the Control-Read-Only Memory CROM Signature Check Logic) without the need for scanning out the contents of the Built-In-Logic-Block-Observation registers BILBO. The verification signal CHECK can be loaded into the existing status register which can be viewed at the device outputs.

TABLE 2

MODE TABLE

| Mode | LOAD | RLOAD | SCAN | FEED_ | RESET | HOLD_ | LFSR_TIMER |
|---|---|---|---|---|---|---|---|
| Parallel-Load-Active | 1 | 1 | X | 1 | 0 | 1 | X |
| Parallel-Load-Hold | 1 | 1 | X | 1 | 0 | 0 | X |
| LFSR Timer | 0 | X | 0 | 0 | 0 | 0 | 1 |
| LFSR Signature | 1 | 1 | 0 | 0 | 0 | 0 | 0 |
| Scan-Shift | 0 | X | 1 | 0 | 0 | 0 | X |
| Shadow-Load | X | X | X | X | 0 | 1 | X |
| Shadow-Observe | 1 | 0 | X | 1 | 0 | 0 | X |
| Reset | X | X | X | X | 1 | 1 | X |

The program and erase instructions are stored in the Control-Read-Only-Memory CROM. As the instructions are executed, data stored in the Control-Read-Only-Memory CROM are transmitted from terminals Q1–QN of the Built-In-Logic-Block-Observation registers BILBO of FIG. 5 to control the circuitry responsible for addressing, programming, erasing and verifying FLASH cells. During execution, the Built-In-Logic-Block-Observation registers BILBO are typically in the Parallel-Load-Active Mode. However, various steps in the instructions require the control outputs Q1–QN to be held while the instructions continue to execute. For these steps, the Built-In-Logic-Block-Observation registers BILBO are placed in the Parallel- The Scan-Shift, Shadow-Load and Shadow-Observe Modes are used during fault testing. The Reset Mode is used to reset all latches while no instruction is executing.

After completing the above-described scan method of testing the Control-Read-Only-Memory CROM signature, the signature is scanned out to both verify the Control-Read-Only-Memory CROM contents and to specify or note the Control-Read-Only Memory CROM version (code version). An alternate status method of verifying the Control-Read-Only-Memory CROM contents is to force the contents of the Built-In-Logic-Block-Observation registers BILBO during the Multiple-Input-Shift-Register MISR Mode to a predetermined state by adding an additional cycle to the analysis step. The purpose of the additional cycle is to take the effective Control-Read-Only-Memory CROM signature and exclusive-OR (Built-In-Logic-Block-Observation register BILBO function) the signature with a special Control-Read-Only-Memory CROM word that results in the known code or predetermined code in the Built-In-Logic-Block-Observation registers BILBO. The additional circuit reduces this known code into a status bit or bits that is read as part of the status word during Special-Test Mode. This step eliminates the test time required for scanning out the vector as well as modifying the test program every time the code changed. Both the first-described method and the latter-described the "status" method may be used on the same chip. With both methods, a generic test program may be used no matter what first-described scan method the Control-Read-Only-Memory CROM code is. However, the scan method may be used to determine actual Control-Read-Only-Memory CROM code version.

In FIG. 5, an output from the register REG associated with the ROMT and QT signals is fed back to the TIMER LFSR FEEDBACK LOGIC circuitry. The value of T depends on the desired pulse length. For example, the value of T may be 18 where N is 24. If N is 64, then the value of T may be, for example, 24.

Figure 6:
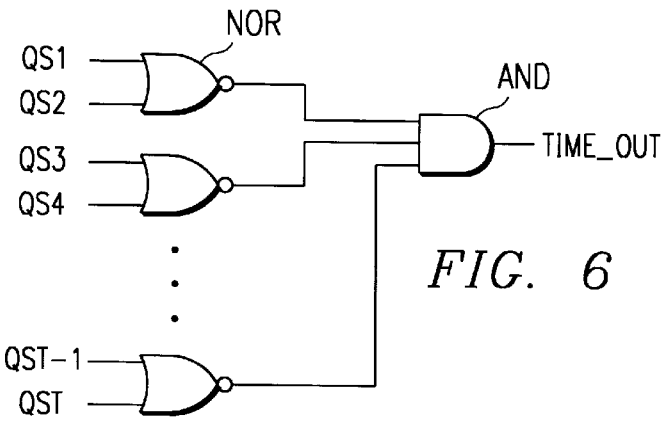
FIG. 6 is an exemplary block diagram circuit illustrating the Timer-End-of-Count-Detector-Logic block of FIG. 5.

FIG. 6 illustrates one embodiment of the circuit of the TIMER END-OF-COUNT LOGIC block of FIG. 5.

Figure 7:
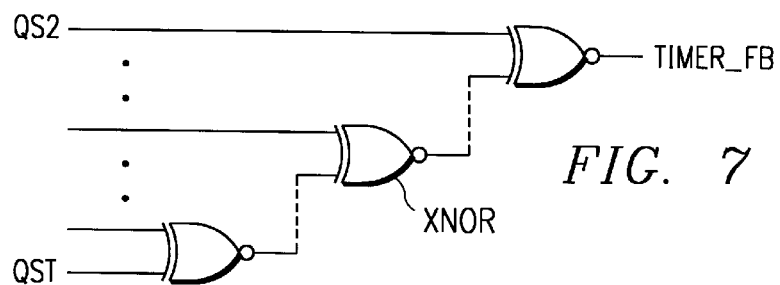
FIG. 7 is an exemplary block diagram circuit illustrating the Timer-LFSR-Feedback-Logic block of FIG. 5.

FIG. 7 illustrates one embodiment of the circuit of the TIMER LFSR FEEDBACK LOGIC block of FIG. 5.

Figure 8:
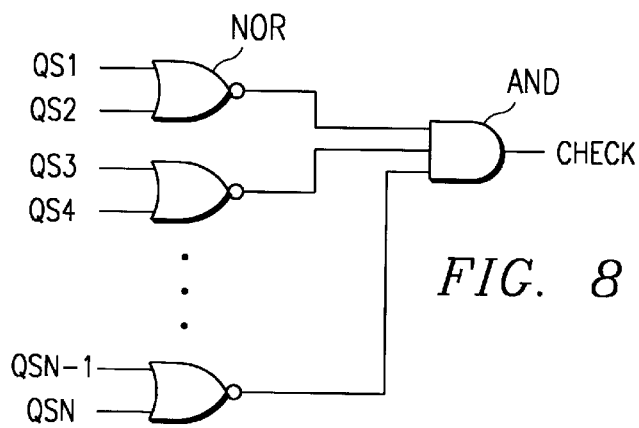
FIG. 8 is an exemplary block diagram circuit illustrating the ROM-Signature-Check-Logic block of FIG. 5.

FIG. 8 illustrates one embodiment of the circuit of the ROM SIGNATURE CHECK LOGIC block of FIG. 5.

Figure 9:
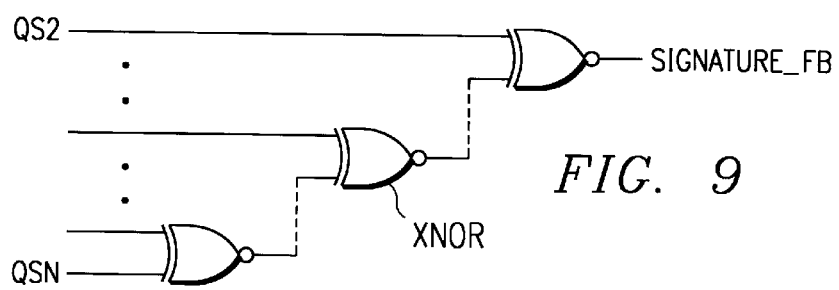
FIG. 9 is an exemplary block diagram circuit illustrating the Signature-LFSR-Feedback-Logic block of FIG. 5.

FIG. 9 illustrates one embodiment of the circuit of the SIGNATURE LFSR FEEDBACK LOGIC block of FIG. 5.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for verifing data stored in a Control-Read-Only-Memory and for providing pulse timing, said method comprising:

causing said data to be transmitted from said Control-Read-Only-Memory to a plurality of series-connected Built-In-Logic-Block-Observation registers, reading a signature output from each of said series-connected Built-In-Logic-Block-Observation registers, using said signature output from said plurality of said series-connected Built-In-Logic-Block-Observation registers to verify said data stored in said Control-Read-Only-Memory, using said Built-In-Logic-Block-Observation registers to perform a pulse-timer linear-feedback-shift function, using said Built-In-Logic-Block-Observation registers to perform a Parallel-Load-Hold Mode function, and using said Built-In-Logic-Block-Observation registers to perform a Shadow-Load Mode function, said Shadow-Load Mode function not having an output defining a test path for carrying test data.

2. The method of claim 1, further including using said Built-In-Logic-Block-Observation registers to perform a Parallel-Load-Active Mode function.

3. The method of claim 1, further including using said Built-In-Logic-Block-Observation registers to perform a Scan-Shift Mode function.

4. The method of claim 1, her including using said Built-In-Logic-Block-Observation registers to perform a Shadow-Observe Mode function.

5. A method for verifying data stored in a Control-Read-Only-Memory, said method comprising:

entering a special word in said Control-Read-Only-Memory, causing said data to be transmitted from said Control-Read-Only-Memory to a plurality of series-connected Built-In-Logic-Block-Observation registers, reading a signature output from each of said series-connected Built-In-Logic-Block-Observation registers, said special word resulting in said signature output, using said signature output from said plurality of said series-connected Built-In-Logic-Block-Observation registers to verify said data stored in said Control-Read-Only-Memory, using said Built-In-Logic-Block-Observation registers to perform a Parallel-Load-Hold Mode function, and using said Built-In-Logic-Block-Observation registers to perform a Shadow-Load Mode function, said Shadow-Load Mode function not having an output defining a test path for carrying test data.

6. The method of claim 5, further including using said Built-In-Logic-Block-Observation registers to perform a Parallel-Load-Active Mode function.

7. The method of claim 5, further including using said Built-In-Logic-Block-Observation registers to perform a Linear-Feedback-Shift-Register Timer Mode function.

8. The method of claim 5, further including using said Built-In-Logic-Block-Observation registers to perform a Scan-Shift Mode function.

9. The method of claim 5, further including using said Built-In-Logic-Block-Observation registers to perform a Shadow-Observe Mode function.

10. Circuitry for verifying data stored in a Control-Read-Only-Memory and for providing pulse timing, said circuitry comprising:

means for causing said data to be transmitted from said Control-Read-Only-Memory to a plurality of series-connected Built-In-Logic-Block-Observation registers, means for reading a signature output from each of said series-connected Built-In-Logic-Block-Observation registers, means for using said signature output from said plurality of said series-connected Built-In-Logic-Block-Observation registers to verify said data stored in said Control-Read-Only-Memory, means for using said Built-In-Logic-Block-Observation registers to perform a pulse-timer linear-feedback-shift function, means for using said Built-In-Logic-Block-Observation registers to perform a Parallel-Load-Hold Mode function, and means for using said Built-In-Logic-Block-Observation registers to perform a Shadow-Load Mode function, said Shadow-Load Mode function not having an output defining a test path for carrying test data.

11. Circuitry for verifying data stored in a Control-Read-Only-Memory, said circuitry comprising:

means for entering a special word in said Control-Read-Only-Memory, means for causing said data to be transmitted from said Control-Read-Only-Memory to a plurality of series-connected Built-In-Logic-Block-Observation registers;

means for reading a signature output from each of said series-connected Built-In-Logic-Block-Observation registers, said special word resulting in said signature output; and means for using said signature output from said plurality of said series-connected Built-In-Logic-Block-Observation registers to verify said data stored in said Control-Read-Only-Memory, means for using said Built-In-Logic-Block-Observation registers to perform a Parallel-Load-Hold Mode function, and means for using said Built-In-Logic-Block-Observation registers to perform a Shadow-Load Mode function, said Shadow-Load Mode function not having an output defining a test path for carrying test data.

* * * * *